United States Patent
Pike et al.

(10) Patent No.: US 6,176,274 B1
(45) Date of Patent: Jan. 23, 2001

(54) METHOD AND SYSTEM FOR MEASURING FLUID VOLUME IN A PHOTOLITHOGRAPHY TRACK

(75) Inventors: Christopher Lee Pike, Fremont; Vincent Lani Marinaro, Sunnyvale, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/336,063

(22) Filed: Jun. 18, 1999

(51) Int. Cl.[7] .......................................................... B65B 1/04
(52) U.S. Cl. .................................. 141/1; 141/83; 141/95; 222/56; 73/3
(58) Field of Search ................................. 141/1, 83, 95, 141/130; 222/56; 73/3

(56) References Cited

U.S. PATENT DOCUMENTS

| | | |
|---|---|---|
| 4,597,507 * | 7/1986 | Rosenblum et al. .................. 222/16 |
| 5,131,591 * | 7/1992 | Gill ...................................... 222/71 |
| 5,377,902 * | 1/1995 | Hayes .................................. 228/254 |

* cited by examiner

Primary Examiner—Steven O. Douglas
(74) Attorney, Agent, or Firm—Sawyer Law Group LLP

(57) ABSTRACT

A method and system for measuring a fluid in a photolithography track is disclosed. The method includes dispensing the fluid in a photolithography track into a self-contained reservoir, and measuring the volume of the fluid using the self-contained reservoir. In a preferred embodiment, the reservoir receives the fluid from the dispenser through a drain pipe. By measuring the volume of fluid in this manner, spillage of fluid is prevented because the volume measuring apparatus in accordance with the present invention is self-contained. This prevents corrosion and other damage to the parts of the photolithography track which come into contact with the spilled fluid. With no spillage, a more consistent volume measurement is obtained. The volume measurement is also much quicker to perform than conventional methods.

16 Claims, 4 Drawing Sheets

METHOD AND SYSTEM FOR MEASURING FLUID VOLUME IN A PHOTOLITHOGRAPHY TRACK

FIELD OF THE INVENTION

The present invention relates to semiconductor fabrication, and more particularly to photolithography in semiconductor fabrication.

BACKGROUND OF THE INVENTION

Photolithography is conventionally used in the fabrication of semiconductor devices. It is typically performed using a device called a photolithography track. An important aspect of photolithography is the development of the photoresist. The dimensions of the photoresist pattern is important in the fabrication of semiconductor device since an etch or implantation of the substrate is performed based upon the photoresist pattern. The photoresist is patterned by a mask. The masked photoresist is then exposed to light from a light source. After exposure, developer is applied to remove the mask and exposed portions of the photoresist, leaving a patterned photoresist behind. The developer is typically a base and water mixture. Photolithography is well known in the art and will not be discussed in detail here.

FIG. 1 illustrates a portion of a conventional photolithography track. The track 100 includes a wafer 102 which may be spun by a chuck and motor 104. While the wafer 102 is spinning, a developer dispenser 106 equipped with a nozzle 108 moves over the spinning wafer 102 and applies an amount of developer to remove the mask and exposed portions of the photoresist, as described above. The dispenser 106 then moves back and rests in a nozzle block 110 which protects the nozzle 108 when the dispenser 106 is not in use. A drain pipe 112 is coupled to the nozzle block 110 for draining any excess developer from the nozzle block 110.

An important parameter in controlling the dimensions and shape of the patterned photoresist is the amount of developer applied. The amount may be determined from the flow rate and application time of the developer. However, it is often more accurate to measure the volume of the developer dispensed from the nozzle 108. A conventional method of performing this volume check involves dispensing the developer at the point of use into a container and then transferring the developer from this container to a volume measuring apparatus. Because the location of the nozzle 108 in the track 100, there is often little room to place a container under the nozzle 108 so that it can catch the developer which is dispersed. Even when a container can be so placed, there is typically some spillage of developer when it is transferred from the container to the measuring apparatus. The spilled developer may then contact parts of the track 100, such as electronic circuitry and wiring, which can lead to corrosion and/or premature failure of those parts. The spilled developer may also results in an inaccurately low volume measurement.

Accordingly, what is needed is an improved method and system for measuring fluid volume in a photolithography track. The method and system should provide a more accurate measurement of developer volume. The present invention addresses such a need.

SUMMARY OF THE INVENTION

The present invention provides a method and system for measuring a fluid in a photolithography track. The method includes dispensing the fluid in a photolithography track into a self-contained reservoir, and measuring the volume of the fluid using the self-contained reservoir. In a preferred embodiment, the reservoir receives the fluid from the dispenser through a drain pipe. By measuring the volume of fluid in this manner, spillage of fluid is prevented because the volume measuring apparatus in accordance with the present invention is self-contained. This prevents corrosion and other damage to the parts of the photolithography track which come into contact with the spilled fluid. With no spillage, a more consistent volume measurement is obtained. The volume measurement is also much quicker to perform than conventional methods.

DETAILED DESCRIPTION

The present invention relates to a method and system for measuring fluid volume in a photolithography track. The following description is presented to enable one ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
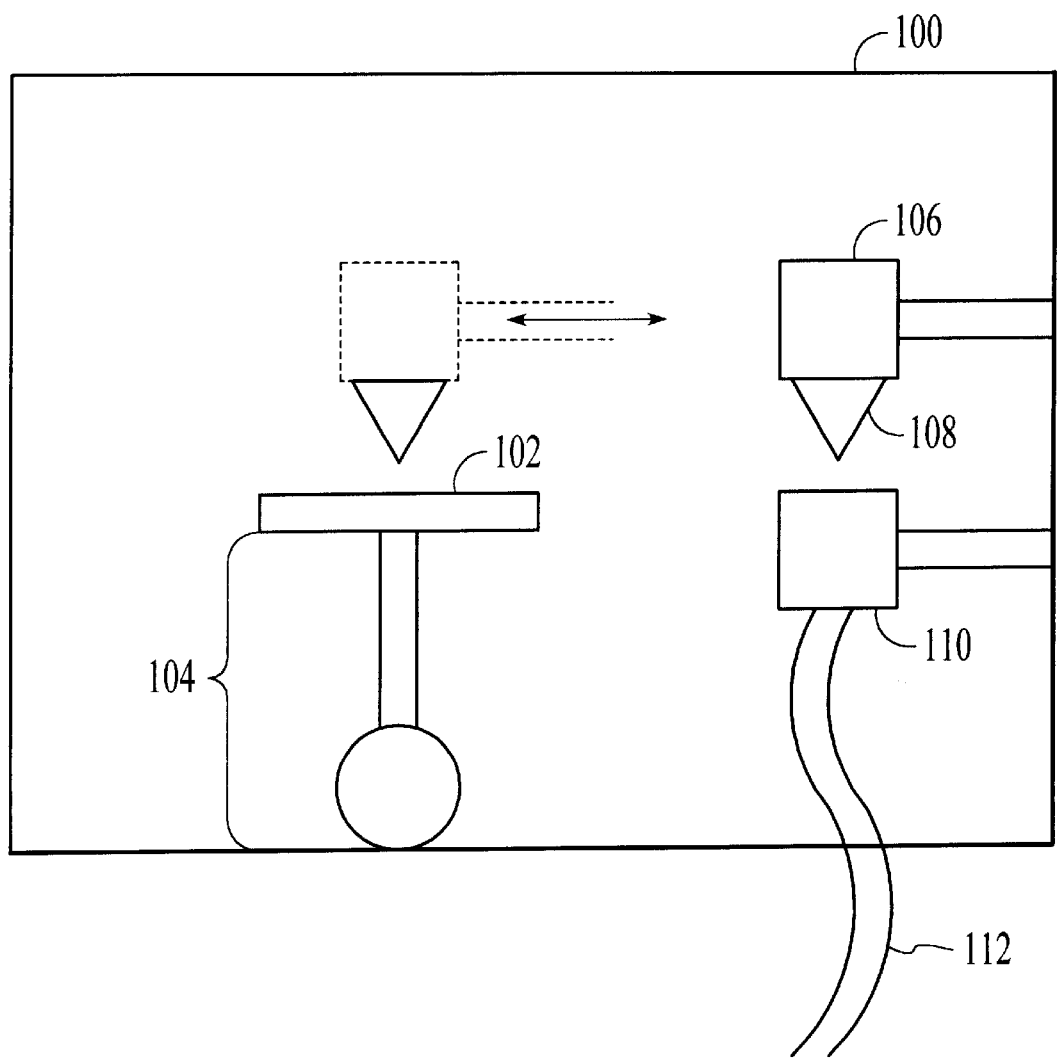
FIG. 1 illustrates a portion of a conventional photolithography track.
Figure 2:
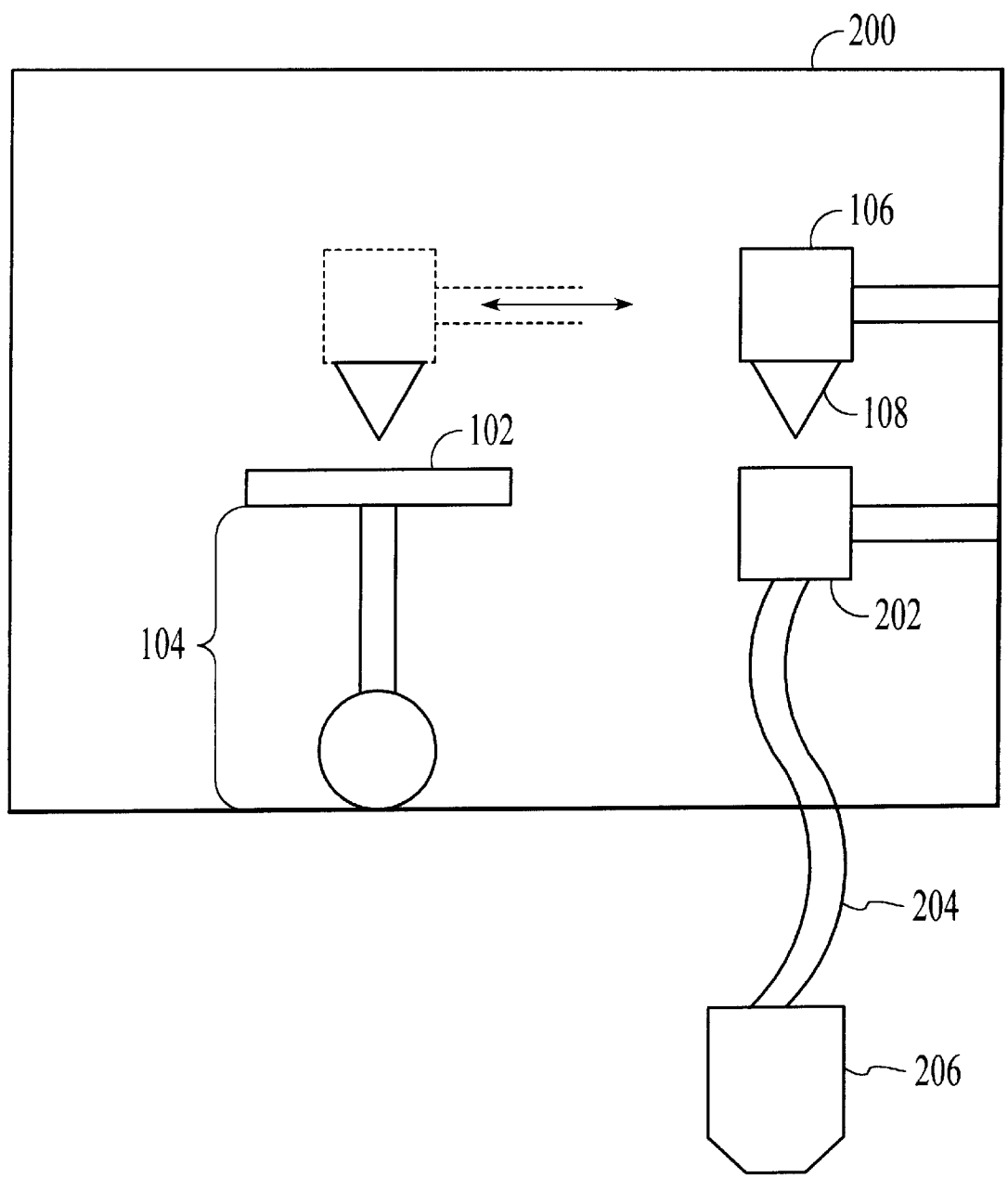
FIG. 2 illustrates a preferred embodiment of a photolithography track with an improved method of measuring developer volume in accordance with the present invention.

FIG. 2 illustrates a preferred embodiment of a photolithography track with an improved method of measuring fluid volume in accordance with the present invention. In the preferred embodiment, the photolithography track 200 comprises a self-contained reservoir 206 which is coupled to the nozzle block 202 via a drain pipe 204. The nozzle block 202 is equipped with a hole (not shown) at its bottom such that a fluid dispensed into the nozzle block 202 may flow into the drain pipe 204. While the nozzle 108 is resting in the nozzle block 202, an amount of developer is dispensed from the nozzle 108. The developer then travels through the hole at the bottom of the nozzle block 202, through the drain pipe 204, and into the self-contained reservoir 206. The volume of the developer in the self-contained reservoir 206 can then be measured.

Although the present invention is described in the context of the photolithography track illustrated in FIG. 2, one of ordinary skill in the art will understand that the present invention may be used with other photolithography tracks without departing from the spirit and scope of the present invention.

Figure 3:
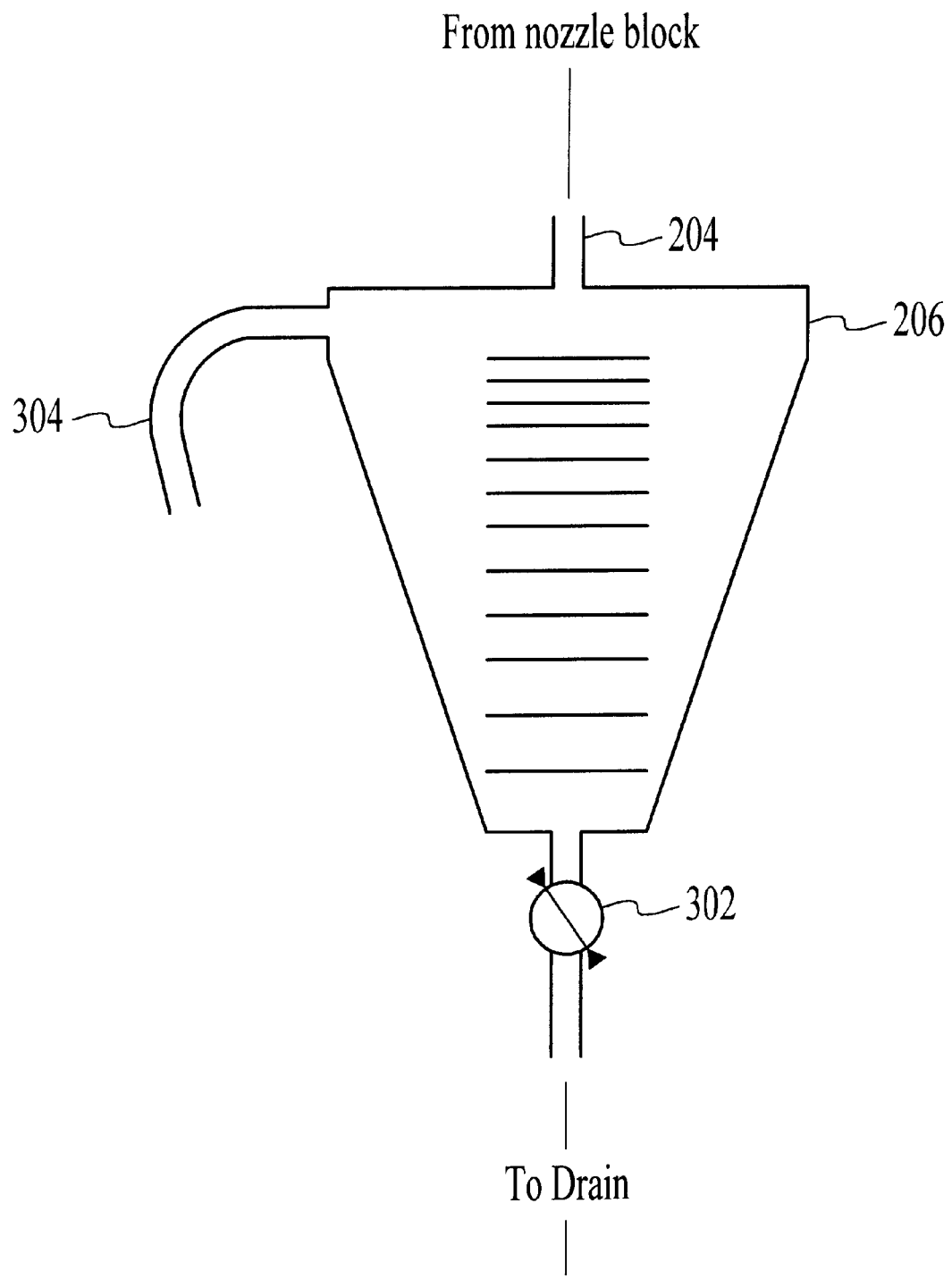
FIG. 3 illustrates a preferred embodiment of the reservoir in accordance with the method and system of the present invention.

FIG. 3 illustrates a preferred embodiment of the reservoir in accordance with the method and system of the present invention. The reservoir 206 is enclosed and is able to hold the developer from the nozzle block 202. In the preferred embodiment, a valve 302 is coupled to the reservoir 206. The developer enters the reservoir 206 through the drain pipe 204. When the valve 302 is closed, the developer is held in the reservoir 206. The reservoir 206 may be graduated such that the volume of the developer may be readily and accurately determined. Once the volume is determined, the valve 302 may be opened, and the developer drains out of the reservoir 206 to a drain (not shown). To prevent overflow, such as when the valve 302 is accidentally left closed, an overflow bypass 304 to the drain may be provided. This prevents the developer from backing up and overflowing at the nozzle block 202.

Although the present invention has been described with a reservoir as illustrated in FIG. 3, one of ordinary skill in the art will understand that other configurations of the reservoir may be used without departing from the spirit and scope of the present invention.

Figure 4:
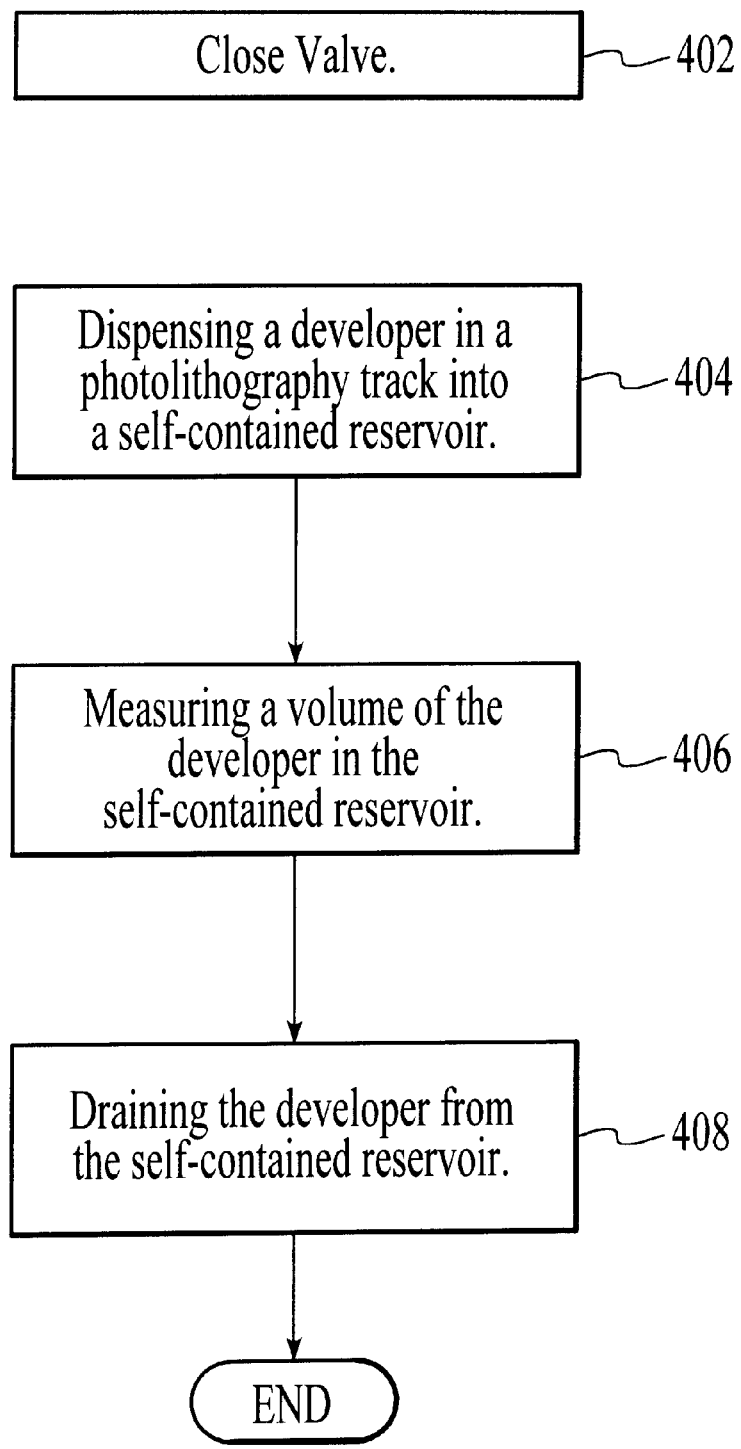
FIG. 4 is a flow chart illustrates a preferred embodiment of a method of measuring developer volume in accordance with the present invention.

FIG. 4 is a flow chart illustrating a preferred embodiment of a method of measuring developer volume in accordance with the present invention. First, the valve 302 is closed. Next, the developer in a photolithography track 200 is dispensed into a self-contained reservoir 206, via step 404. In the preferred embodiment, the developer is dispensed from the nozzle 108 into the nozzle block 202, and the dispensed developer enters the reservoir 206 through a drain pipe 204 coupled between the nozzle block 202 and the reservoir 206. The volume of the developer in the self-contained reservoir 206 is measured, via step 406. Then, the developer is drained from the self-contained reservoir 206, via step 408.

Although the present invention is described in the context of measuring the volume of developer, one of ordinary skill in the art will understand that other fluid volumes may be measured without departing from the spirit and scope of the present invention. For example, the volume of de-ionized water may be measured without departing from the spirit and scope of the present invention.

A method and system for measuring fluid volume in photolithography has been disclosed. By measuring the volume of fluid in this manner, spillage of fluid is prevented because the volume measuring apparatus in accordance with the present invention is self-contained. This prevents corrosion and other damage to the parts of the equipment which come into contact with the spilled fluid. With no spillage, a more consistent volume measurement is obtained. The volume measurement is also much quicker to perform than conventional methods.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A method for measuring fluid, comprising the steps of:
(a) dispensing a fluid in a photolithography track into a self-contained reservoir, wherein the dispensing step (a) comprises:
(a1) dispensing a fluid in the photolithography track from a dispenser nozzle into a nozzle block; and
(a2) draining the dispensed fluid from the nozzle block to the self-contained reservoir through the drain pipe; and
(b) measuring a volume of the dispensed fluid in the self-contained reservoir.

2. The method of claim 1, further comprising:
(c) draining the fluid from the self-contained reservoir.

3. A method for measuring fluid, comprising the steps of:
(a) dispensing a developer in a photolithography track into a self-contained reservoir, wherein the dispensing step (a) comprises:
(a1) dispensing the developer in the photolithography track from a dispenser nozzle into a nozzle block; and
(a2) draining the dispensed developer from the nozzle block to the self-contained reservoir through the drain pipe; and
(b) measuring a volume of the dispensed developer in the self-contained reservoir.

4. The method of claim 3, further comprising:
(c) draining the fluid from the self-contained reservoir.

5. A method for measuring fluid, comprising the steps of:
(a) dispensing a developer in a photolithography track from a dispenser nozzle into a nozzle block;
(b) draining the dispensed developer from the nozzle block to a self-contained reservoir through a drain pipe;
(c) measuring a volume of the dispensed developer in the self-contained reservoir; and
(d) draining the dispensed developer in the self-contained reservoir.

6. A system, comprising:
a photolithography track, comprising a dispenser of a fluid, wherein the fluid is dispensed into a nozzle block; and
a self-contained reservoir coupled to the photolithography track for receiving the dispensed fluid, the self-contained reservoir capable of measuring a volume of the dispensed fluid.

7. The system of claim 6, wherein the dispenser comprises:
a nozzle; and
a nozzle block, the nozzle block having a hole through which the fluid may flow.

8. The system of claim 6, further comprising:
a drain pipe coupled between the dispenser and the self-contained reservoir;
a valve coupled to the self-contained reservoir for draining and preventing the draining of the fluid from the self-contained reservoir; and
an overflow bypass coupled to the self-contained reservoir capable of draining an overflow of the fluid from the self-contained reservoir.

9. A system, comprising:
a photolithography track, the photolithography track comprising a dispenser of a fluid, the dispenser comprising:
a nozzle, and
a nozzle block;
a self-contained reservoir for measuring a volume of the fluid dispensed from the nozzle into the nozzle block; and
a drain pipe coupled between the nozzle block and the self-contained reservoir.

10. The system of claim 9, further comprising:
a valve coupled to the self-contained reservoir for draining and preventing the draining of the fluid from the self-contained reservoir; and
an overflow bypass coupled to the self-contained reservoir capable of draining an overflow of the fluid from the self-contained reservoir.

11. A system, comprising:

a photolithography track, the photolithography track comprising a dispenser of a developer, the dispenser comprising:
- a nozzle, and
- a nozzle block;
- a self-contained reservoir for measuring a volume of the developer dispensed from the nozzle into the nozzle block;
- a drain pipe coupled between the nozzle block and the self-contained reservoir;
- a valve coupled to the self-contained reservoir; and
- an overflow bypass coupled to the self-contained reservoir.

12. An apparatus, comprising:

a self-contained reservoir capable of measuring a volume of a dispensed fluid; and a means coupled to the self-contained reservoir for receiving the fluid dispensed from a nozzle into a nozzle block of a photolithography track, wherein the receiving means is a drain pipe coupled between the self-contained reservoir and the photolithography track.

13. The apparatus of claim 12, further comprising:

a valve coupled to the self-contained reservoir for draining and preventing the draining of the fluid from the self-contained reservoir; and an overflow bypass coupled to the reservoir capable of draining an overflow of the fluid from the self-contained reservoir.

14. An apparatus, comprising:

a self-contained reservoir capable of measuring a volume of a fluid dispensed from a nozzle into a nozzle block; and a drain pipe coupled to the self-contained reservoir for receiving the fluid from a photolithography track.

15. The apparatus of claim 14, further comprising:

a valve coupled to the self-contained reservoir for draining and preventing the draining of the fluid from the self-contained reservoir; and an overflow bypass coupled to the self-contained reservoir capable of draining an overflow of the fluid from the self-contained reservoir.

16. An apparatus, comprising:

a self-contained reservoir capable of measuring a volume of a developer;

a drain pipe coupled to the self-contained reservoir for receiving the developer dispensed from a nozzle into a nozzle block of a photolithography track;

a valve coupled to the self-contained reservoir for draining and preventing the draining of the fluid from the self-contained reservoir; and an overflow bypass coupled to the self-contained reservoir capable of draining an overflow of the developer from the self-contained reservoir.

* * * * *